United States Patent [19]

Belter

[11] Patent Number: 5,969,752
[45] Date of Patent: Oct. 19, 1999

[54] MULTI-FUNCTION VIEWER/TESTER FOR MINIATURE ELECTRIC COMPONENTS

[75] Inventor: Robert Belter, Oceanside, Calif.

[73] Assignee: Electro Scientific Industries, Portland, Oreg.

[21] Appl. No.: 09/094,939

[22] Filed: Jun. 15, 1998

[51] Int. Cl.$^6$ ................................. H04N 7/18; H04N 9/47
[52] U.S. Cl. ............................ 348/125; 348/95; 348/134; 348/126
[58] Field of Search ............................ 348/125, 126–134, 348/86, 87–95; 382/141; 356/240; H04N 7/18, 9/47

[56] References Cited

U.S. PATENT DOCUMENTS

| | | | |
|---|---|---|---|
| 4,406,373 | 9/1983 | Braden | 209/574 |
| 4,912,554 | 3/1990 | Neri | 348/125 |
| 5,226,382 | 7/1993 | Braden | 118/406 |
| 5,305,099 | 4/1994 | Morcos | 348/88 |
| 5,409,119 | 4/1995 | Rao Datari | 348/125 |

*Primary Examiner*—Bryan Tung
*Assistant Examiner*—Nhon T. Diep
*Attorney, Agent, or Firm*—John J. Murphey

[57] ABSTRACT

A surface mount component outer surface inspection system comprising a loader for assembling an inventory of surface mount components and feeding them outward in controlled rectilinear manner and in a timed sequence, a first transfer assembly including a first moving endless belt in racetrack pattern, the belt having a partially perforated outer surface and a vacuum pulled through the perforations from the outer surface along a portion of the belt, for receipt of and retaining the surface mount components from the loader in spaced-apart arrangement on the belt, a surface-mount component, upper-surface viewing device for bringing the exposed surfaces of the moving components into focus at an area for inspecting them for visual defects, a second transfer assembly including a second moving endless belt in racetrack pattern, the belt having a partially perforated outer surface and a vacuum pulled through the perforations from the outer surface along a portion of the belt, the second assembly adjacent the first endless belt located outside of the vacuum area of the first belt and spaced-apart from the upper-surface viewing device, for receipt of the surface-mount components on the opposite sides thereof from the first belt surface in similar spaced-apart arrangement, a surface-mount component, lower-surface viewing device for bringing the exposed surfaces of the components into focus at an area for inspecting them for visual defects, and means for determining the location of surface-mounted components that have failed the visual inspection and following same to a point where the failed components can be separated from other, successfully tested components on the second transfer assembly.

54 Claims, 7 Drawing Sheets

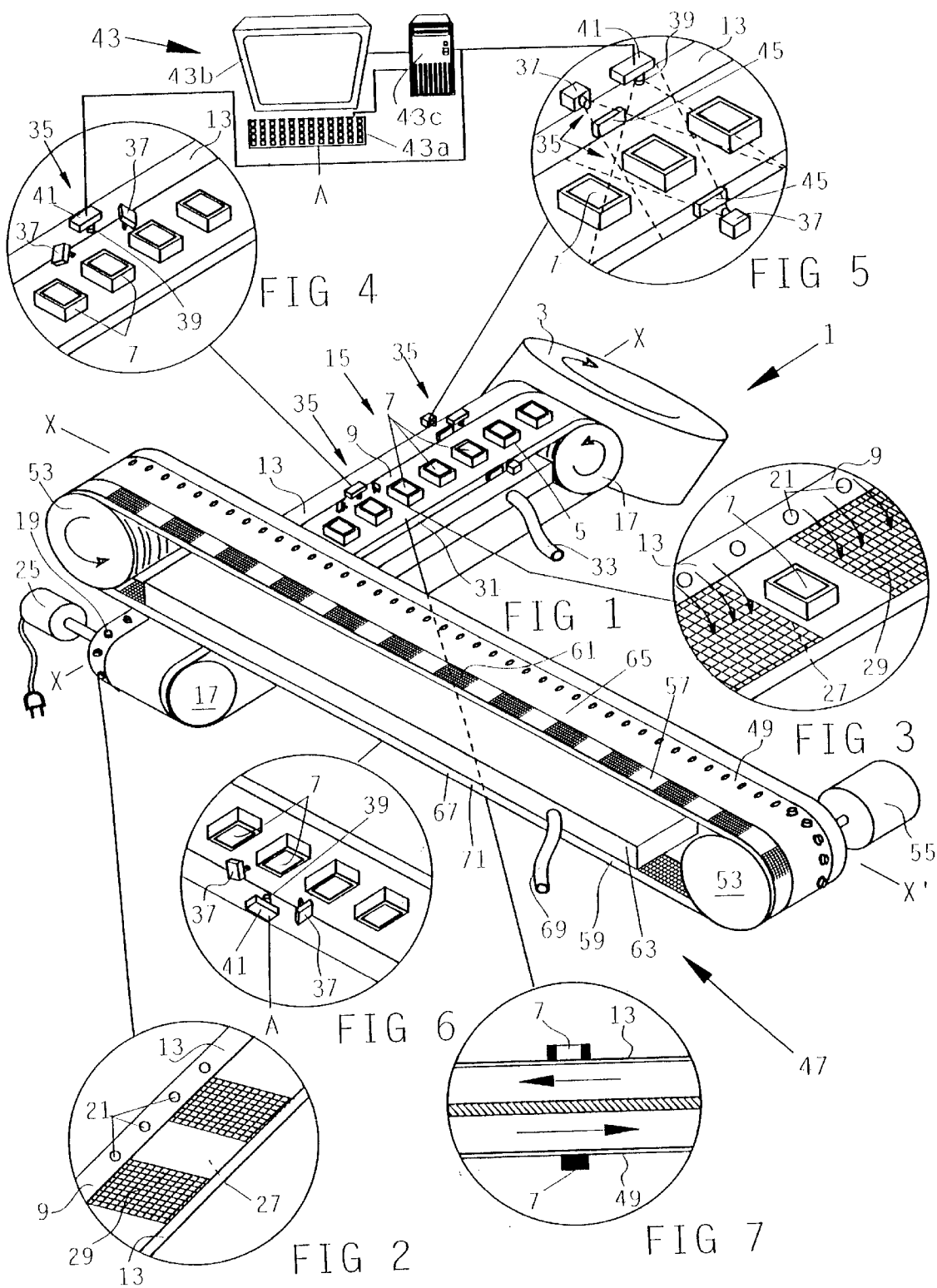

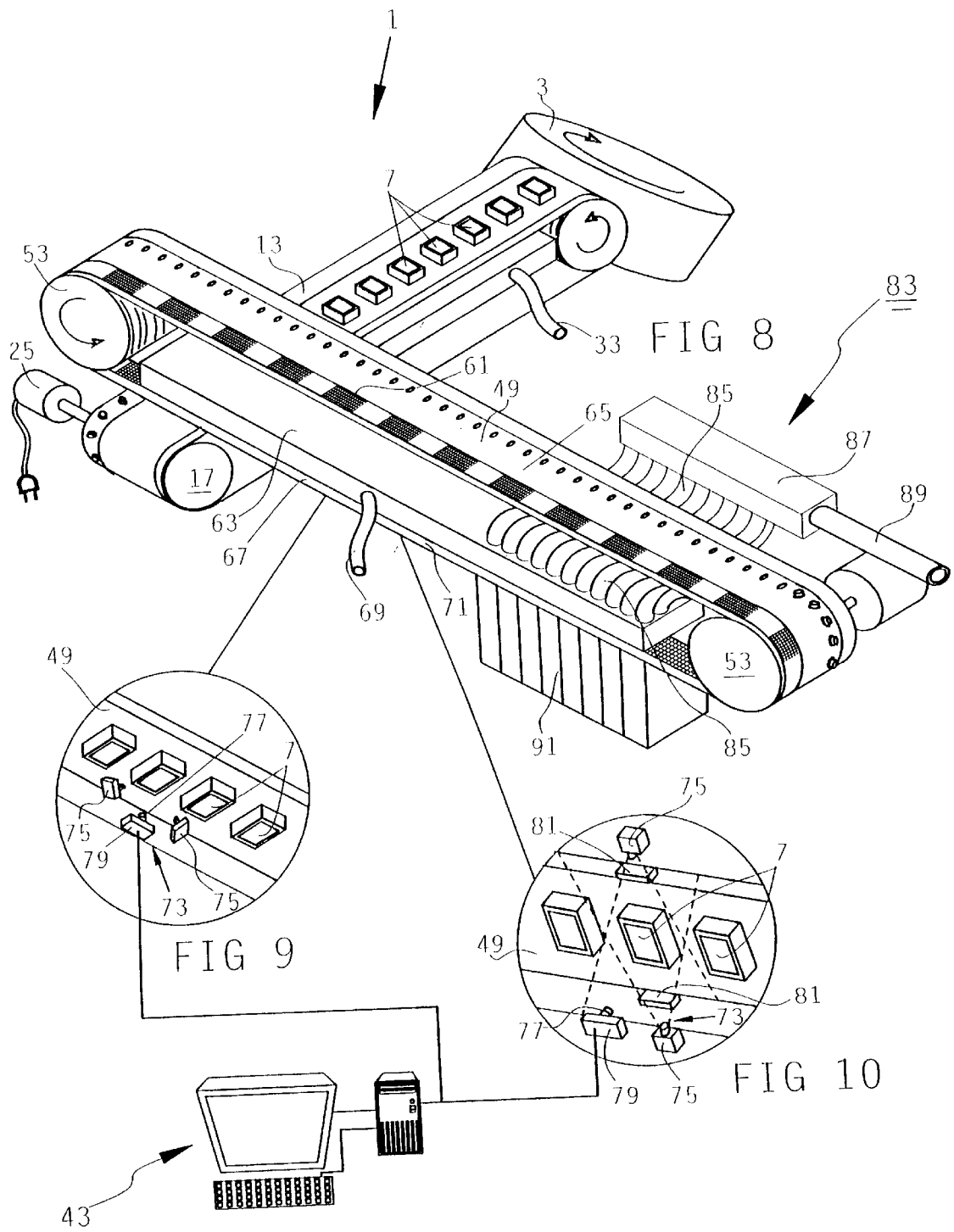

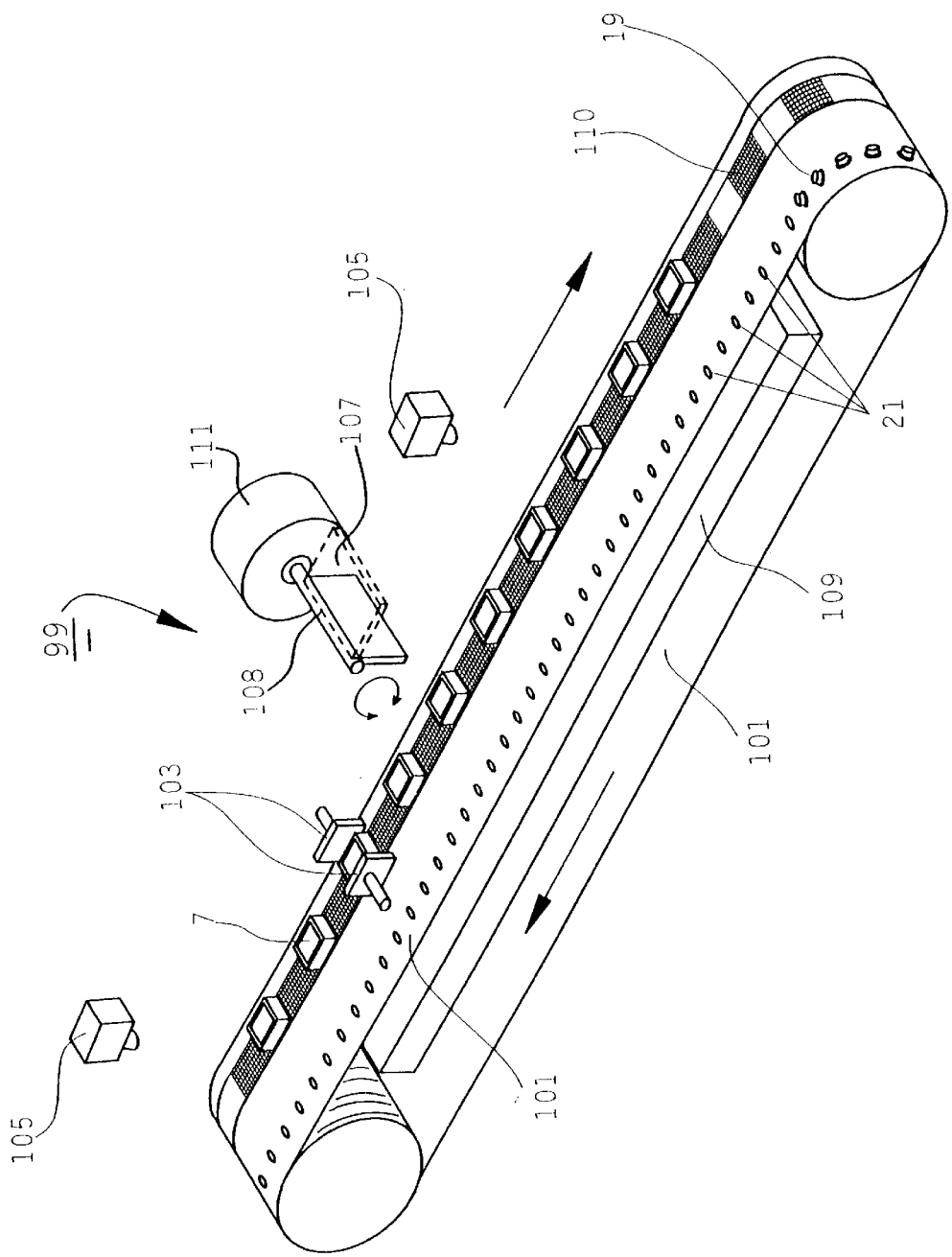

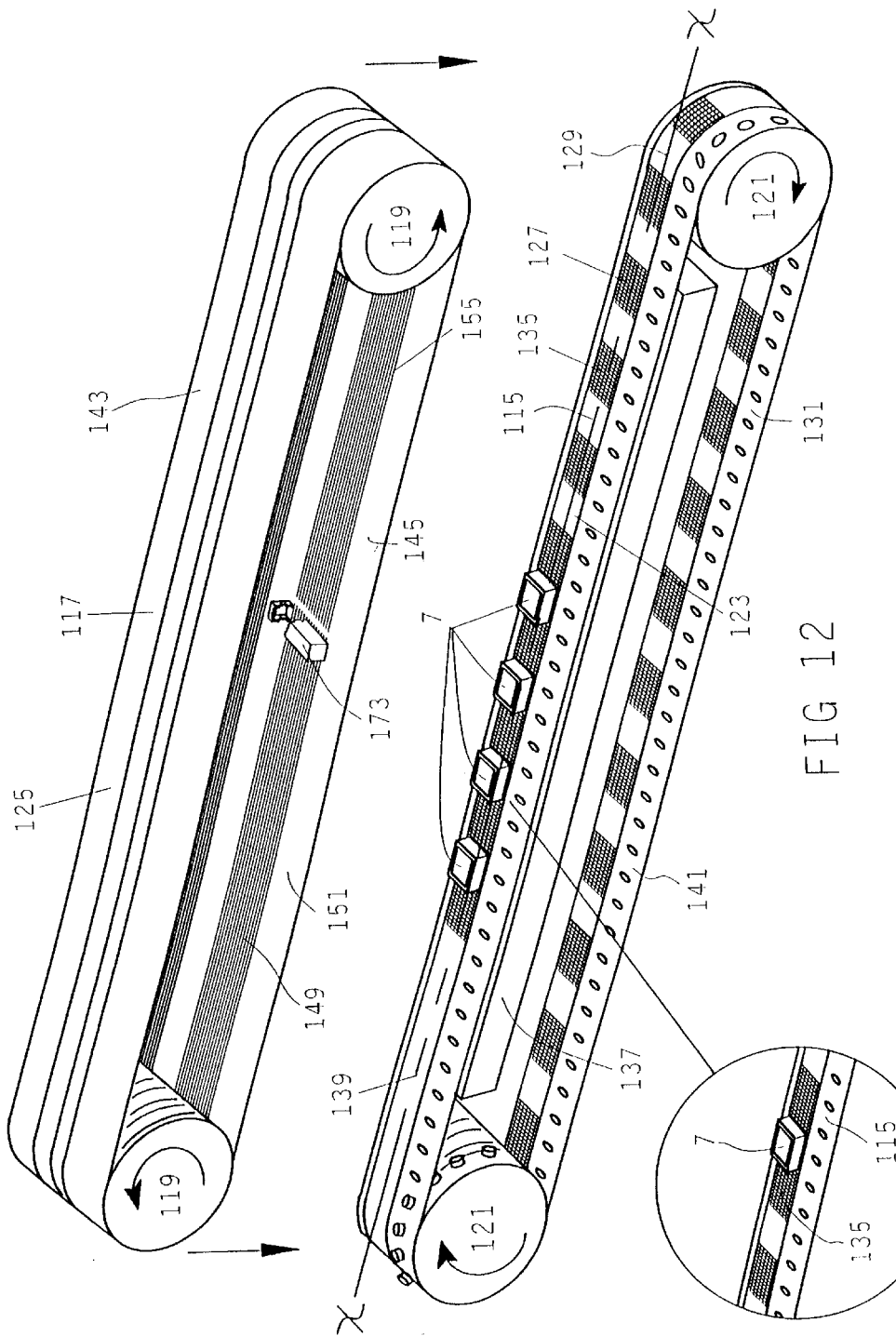

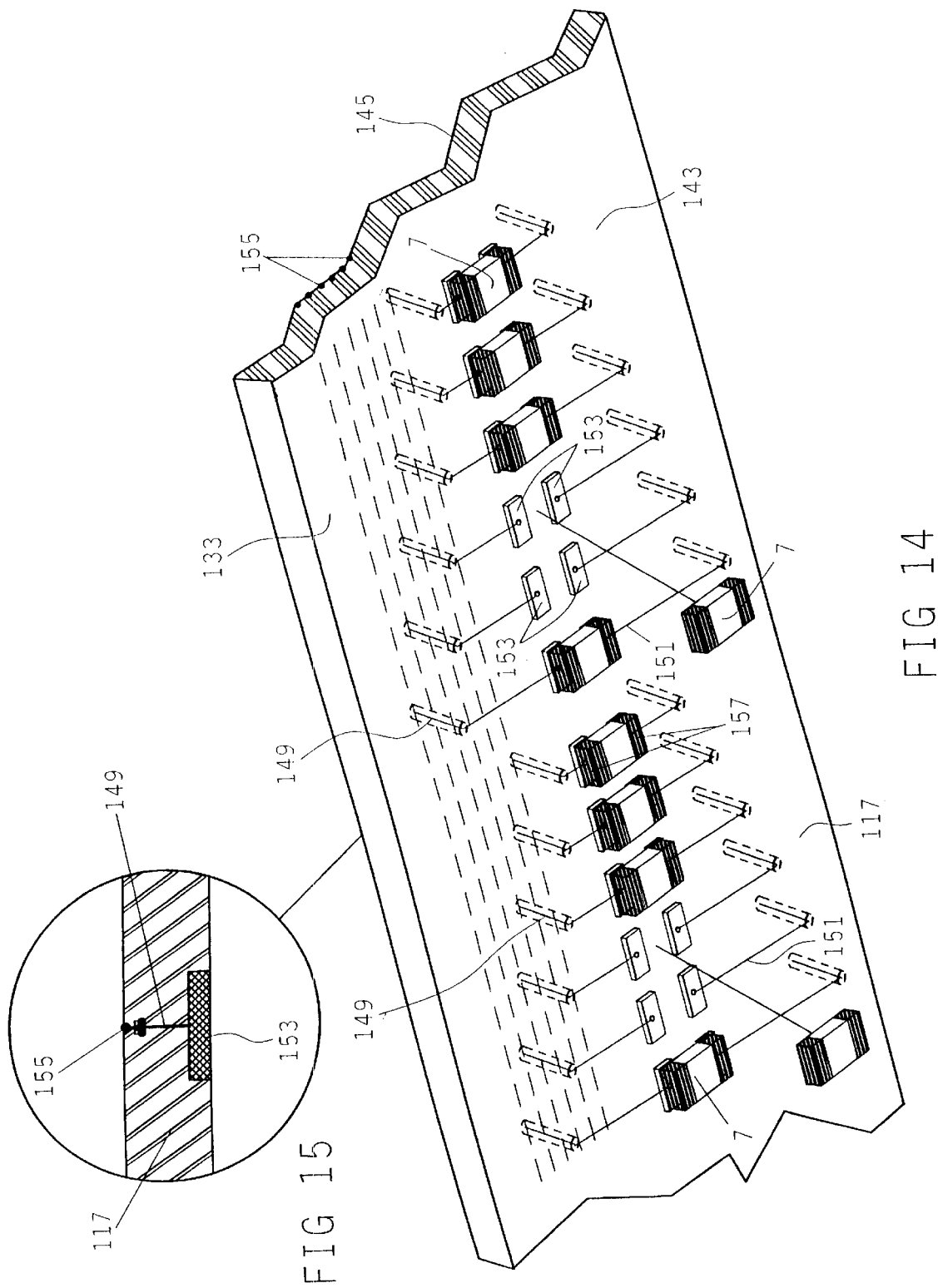

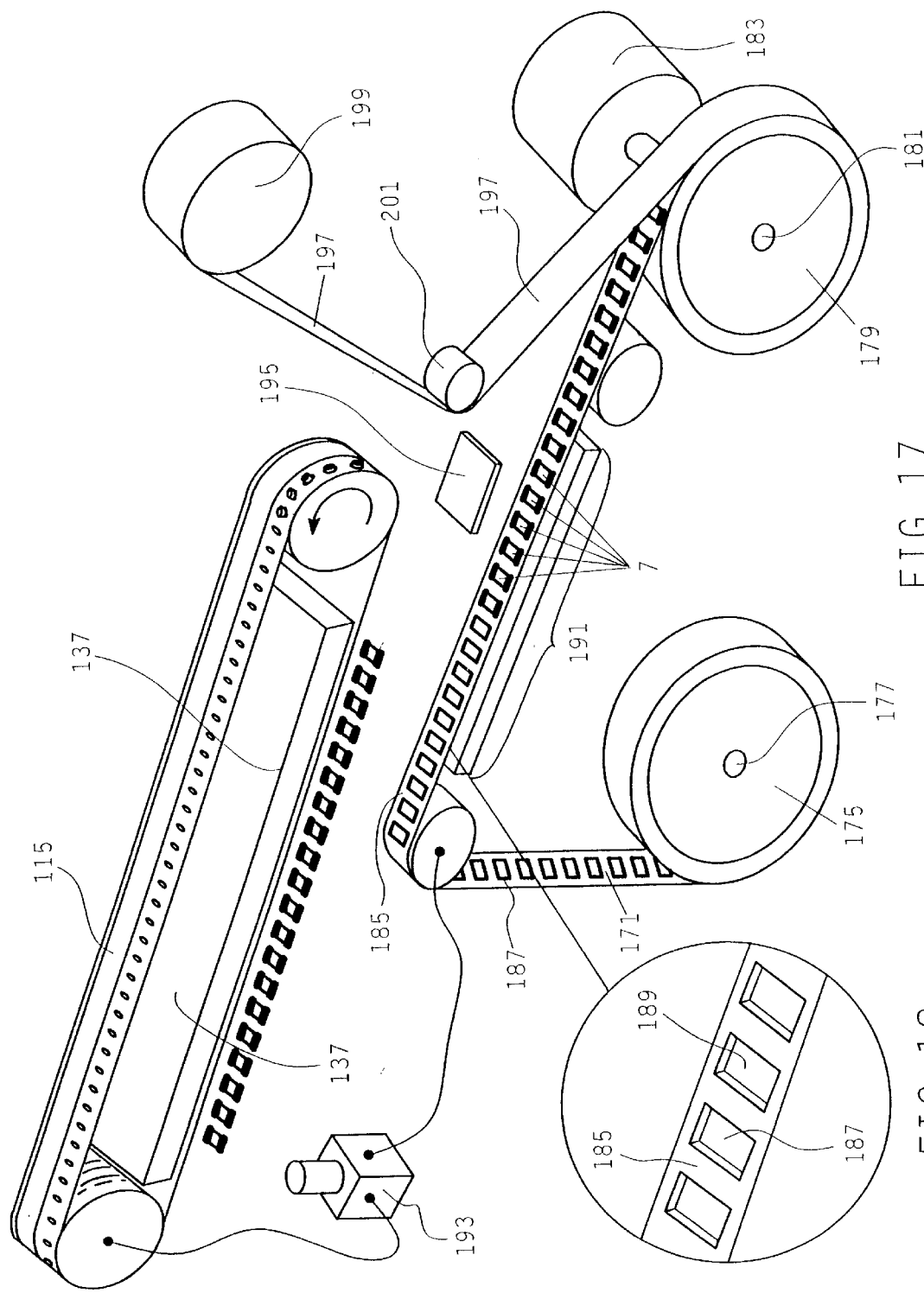

MULTI-FUNCTION VIEWER/TESTER FOR MINIATURE ELECTRIC COMPONENTS

BACKGROUND OF THE INVENTION

1. Field of the Invention

This invention pertains to the field of miniature electric components such as miniature computer capacitor chips and resistor chips used in various circuitry in the computer industry. These are called various names, such as "chips", "integrated passive components", "surface mount components", "array chips" and the like. More particularly, this invention pertains to a novel means of handling these miniature components for such operations as performing visual surface inspections that are required to sort them according to pass/fail visual inspections and electrical tests.

2. Description of the Prior Art

Developments in the computer industry continue at an unabated pace. Computers continue to grow in importance in our daily lives almost, it appears, to the point of dominating them. Computers reach all ages and areas of activity. Infants are exposed to computers through computer games that teach musical tones and image recognition. Computer games are available for preschoolers that lay the basis for enchancement of math, reading and geography skills. Elementary, junior high, high school and college students take classes in computer theory, programming and operation. For those who entered the work force before computers became a part of daily life, seminars, home-study courses and public television courses are offered to introduce the use of computers, computer operation and software opportunities. Every business in the United States of America uses computers somewhere in its operation.

The increased use of computers in business and education has created a demand for more computer capacity and faster processing times. It seems that each year, computers are made with greater performance and memory. Only a few years ago, computer memory was measured in megabytes whereas, today, it is measured in gigabytes. In addition, other electronic devices, such as VCRs, television sets, cameras, camcorders, auto alarms, radios and the like are all using more and more computer hardware to expand their capabilities. Competition among various electronic companies has forced computer and computer-accessory manufacturers to design more powerful and more capable circuitry.

At the center of all this activity are electronic components so small that one could easily overlook them. They are miniature capacitors and like devices, of a general size of 0.040 inches long with a square or rectangular cross-section 0.020 inches on a side, with spaced-apart, flat, end surfaces. These miniature capacitors are constructed of multiple layers of electrically conductive material held apart by minute layers of a ceramic dielectric that are assembled and fired to produce a tiny, ceramic device much smaller than a grain of rice. They are used by the thousands in computer circuitry. As such, they are in great demand. There are resistors of the same general size and shape that are included in the generic term "chips". Even more astonishing is the fact that some of these chips are now being made in multiple units, still smaller than a grain of rice, that have segregated conductive end surfaces. In computer circuitry, these chips are soldered directly to the computer circuit board on their flat side surface so that soldering connecting wires to the circuit board is eliminated.

These devices are so small that hundreds of them are contained in a teaspoon full. They are so small as to be incapable of visual inspection except under an intense magnifying lens, such as a microscope. In forming the solderable connections of this minute chips, the specifications call for accuracy in the order of a very few thousandths of an inch. Surface tension and other physical chemistry phenomena cause flaws to be developed in the surfaces of the chips that can render the chips unusable provided the flaw can be observed in time to remove the chip from further processing. For the special soldering techniques required on these minute chips, the conductive ends of the computer capacitor chips are coated with a silver paste, dried, and later fired at high heat to cure or set the silver paste. The conductive ends are thereafter treated with other materials, such as nickel plating, and the like, to make them amenable to being soldered to a specially designed copper "flat" or "trace" located on the computer circuit board. To apply this silver paste (called "terminating") to the computer capacitor chips, certain inventions have been made, in hand-operated tools and in machine-handling mechanisms, with which to position the chips for coating.

But metalizing and curing these computer capacitor chips is only part of the process. Before using them in any circuitry, each chip must be visually inspected for surface flaws and further tested to determine if it is of a capacitance value usable in a specific electric circuit and if it possesses sufficient other electrical and physical properties that will allow it to withstand the rigors of electrical operation. Further, each chip must be sorted into groups of pass/fail visual inspection and specific ranges of electrical properties so that they can be used most effectively in electronic circuitry.

Because of imperfections in materials and the multi-step nature of the chip-building process, each chip that has already been examined and found to be without surface flaws, still winds up with certain "parasitic" qualities, i.e., impedance qualities in addition to capacitance. Each parasitic quality affects and modifies the chip's capacitor characteristics. Accordingly, it is important to determine the nature and value of these parasitic qualities before inserting the chip into the electrical circuit.

The property of a capacitor that limits the flow of alternating current is called its reactance ($X_c$) and is measured in ohms. The term impedance (Z), also measured in ohms, includes the effect of ordinary ohmic resistance as well as reactance.

"Capacitance" is simply the ratio of the charge acquired (Q) to the applied voltage (V) for any given pair of conductors that are near one another. More specifically:

$$\text{Capacitance} = \frac{\text{charge on either plate}}{\text{potential difference}}$$

$$C(\text{Farads}) = \frac{Q(\text{coulombs})}{V(\text{volts})}$$

A capacitor has a capacitance of one farad (F) if one coulomb of charge causes a potential difference of one volt. For most computer applications, however, a chip is measured in microfarads (1 $\mu F = 10^{-6}$ F) or picofarads (1 pF = $10^{-12}$ F). The test to measure the capacitance of the chip is called the "capacitance" (or CAP) test.

An ideal pure reactance dissipates no power; all energy used to charge the capacitor is recovered upon discharge. In the real world, however, there is always some associated resistance that dissipates some power thereby decreasing the amount of energy that can be recovered. A quality factor (Q) is used to describe a capacitors' purity. Q is $2\pi$ times the ratio of energy stored to energy lost (over unit time), and is a unitless number. A Dissipation Factor (or Df) test is used to determine this property of the chip.

A "Flash" test is conducted on the chip for detecting internal flaws which are detrimental to the electrical integrity of the capacitor and cannot be found with normal capacitance and dissipation factor measurements. The most commnon surface flaws are cracks in the surface and smear or spill-over of solder from one conductor to another or to a spot on the surface that is designed to remain free of solder. The most common internal flaws take the form of irregular voids, cracks or open areas in the dielectric material that separates the conductors, embedded foreign material, thin spots in the dielectric or electrode, and poor contact between the electrodes and the terminiation paste. To uncover surface flaws, the chip is subjected to visual examination under a high-power microscope. To uncover internal flaws, the chip is typically subjected to a test voltage of more than twice its rated voltage, held (soaked) at that voltage for a short period of time, and any loss of voltage thereafter is measured.

The sequence of the "Flash" test is:
  a. Part Present Test—verifies the capacitor is present and made good contact with the test probes.
  b. Charge—the capacitor is charged with a constant current to the proper stress voltage.
  c. Soak—the capacitor is held at this voltage for a short period of time.
  d. Test—leakage current through the capacitor is compared against a limit.
  e. Discharge—the capacitor is discharged at some constant current rate.
  f. Part Present Test—insures the capacitor did not open during previous testing.
  g. Check Test—performed because the capacitor may fail under the stress of the discharge as well as the charge itself. This test is a repeat of the previous test, only with a reduced voltage (usually the rated voltage).

The insulation resistance (or IR) is a measure of leakage current across the capacitor and is the product of the chip's resistance and capacitance. For example, a 1 $\mu$F capacitor tested at 25 vdc with 1000 M$\Omega$ resistance, has an IR of 1000$\Omega$-$\mu$F, or a leakage current of 0.025 $\mu$A. This test is usually conducted by charging the capacitor over a long period of time to insure a maximum charge, removing the charging electrodes, monitoring the discharge over a short period of time, and calculating the internal resistance of the chip by its rate of decay.

For efficiency in operation, these tests are usually performed sequentially as follows:
  a. Station 1—Both CAP and Df
  b. Station 2—Flash
  c. Station 3—IR
  d. Station 4—Both CAP and Df (redundant)

Also, since the soak time for the true IR test can be several seconds, there is often more than one station for the IR test, sometimes up to 10 charging stations and a single test station. This way, the chip can keep moving along with other chips through the test machine, and still be subject to the IR test, without slowing down the entire testing procedure.

Each of these tests requires physical contact with the conductive ends of the chips. In some tests, the contact is single and only momentary. In other tests, the contact is multiple and/or prolonged. Prior to these required tests, others have invented a machine to conduct tests upon those chips and sort them pursuant to their test results, reference U.S. Pat. No. 4,406,373. This patented machine relies on the process of placing the chips in a planar carrier and arranging the holes in straight files and straight rows. The carrier is first laid flat and loose chips cast over it, and the bank subjected to vibration to urge the chips into the holes. The chip-filled carrier is then raised up and placed on a trolley at an oblique angle, and indexed past a plurality of test probes. The chips rest against, or abut, a conductive layer and the probes are advanced into contact with only one end of the chip, the other end being treated in common with other chips through the conductive layer. Once the row of chips has been tested, the carrier passes into contact with a set of receptacles where the values assigned to a particular chip during testing finds a corresponding receptacle having a range of values into which the chip's value fits, whereupon the chips are blown by compressed air out of their respective holes and into a particular receptacle.

The problem with this machine is that it is a batch process and does not have the capacity to rapidly test and sort the large quantities of capacitor chips needed in today's markets. In addition, the tests that can be conducted with this machine are limited and cannot involve all of the tests now needed on modern chips. The patented machine has been modified to run by robotics; however, it remains a batch process with limited testing, high labor costs, and low output. In this patented machine with its robotic improvements, significant time is lost in loading the planar carrier with chips and transferring them to the machine to begin the testing operation, as well as removing the empty carrier and relocating it to a remote area for reloading with fresh chips. This lost time has become an important factor of late where higher and higher throughput rates are demanded in the industry.

SUMMARY OF THE INVENTION

The instant machine that is the subject of this patent application is for the continuous external and internal testing of large volumes of miniature electronic devices such as surface mount capacitor chips. In addition to being continuous in operation, it can perform all the tests heretofore described above and in a sequence which is desired under present standards. This novel machine reduces chip handling time and the chips are less likely to be contaminated or subject to damage before being placed in an electronic circuit and soldered into position. The savings in handling and testing reduces manufacturing and processing costs and results in a better product.

The invention includes a novel means of holding the chips in position on a moving surface for external inspection of all surfaces thereof and a novel means of bringing the soldered ends thereof into electrical contact with testing probes or electrodes. The system can handle the chips at high speed and, thus, at a high volume so as to lower unit costs. By means of this invention, less physical handling is involved, a higher through put is achieved, and the costs associated with inspection and testing the chips are significantly reduced.

The belt in which the chips are originally loaded is designed to position them for inspection of all exterior surfaces without the intervention of human contact. Human contact raises the possibility of contamination of the surface of the electrodes with moisture, oil and dead skin particles that, ultimately, will damage the bonding between the electrode and the copper flat or trace. The entire exterior surface of the chip is open to inspection by a unique system whereby the chip is held by vacuum pressure against one moving belt that brings the chips past a lens and/or reflectors that focus the surfaces on a lens system that is part of a charge— coupled device (CCD) camera for visual inspection, then transfers the chips to another moving belt that is held by vacuum pressure against another moving belt that brings the other exterior surface (upper or lower) past another lens and/or reflectors and CCD camera for the rest of the visual inspection. The chips that pass this visual inspection are then carried by the moving belt into overhead contact with electrodes carried on a test belt that is arranged to come into contact with the metal ends of the chips. The electrodes are connected to a series of testing stations where they are contacted, during movement on the belt, to a series of testers. During this travel, the moving endless metal carrier belt includes an upper surface, a lower surface and a free span thereof wherein said belt includes means for temporarily holding a computer capacitor chip in fixed position on said upper surface by vacuum applied from said lower surface.

Accordingly, the main object of this invention is a machine that can handle, move, and perform exterior and interior testing of miniature computer capacitor chips on a continuous basis. Other objects of the invention include a machine that performs a plurality of tests in ordered sequence on the chips, preferably one at a time, and that thereafter may be used to assign electric values to those that have passed the visual inspection; a machine that continuously moves and tests, for later sorting, the miniature chips without interruption; a machine that contacts the miniature chips using probes or electric contacts that come into contact with the conducting surfaces of the chip so that each one is provided with an exclusive circuit to test as opposed to having all the chips grounded to a common conductive plate; a machine that requires less operator attention than those currently employed; a machine that has a higher handling rate and throughput than any machine now in existence; a machine that handles the chips in a more gentle fashion than that of the prior art and, a machine that utilizes less space and fewer parts than other machines performing the same or similar functions.

These and other objects of the invention may be determined by reading the description of the preferred embodiments along with the drawings attached hereto. The scope of protection sought by the inventor may be gleaned from a fair reading of the claims that conclude this specification.

DESCRIPTION OF THE DRAWINGS

FIG. 1 is an illustrative view of the first and second transfer assembly of this invention;

FIG. 2 is a close-up view of the first endless belt;

FIG. 3 is another close-up view of the first endless belt;

FIG. 4 is a close-up view of part of the CCD camera used in the invention;

FIG. 5 is another close-up view of part of the CCD camera used in the invention;

FIG. 6 is another close-up view of part of the CCD camera used in the invention;

FIG. 7 is an illustrated view of both belts moving in opposite directions and carrying the chip to be inspected on the top outside surface of one belt and the bottom outside surface of the other belt;

FIG. 8 is another perspective view of the first and second transfer assembly of this invention;

FIG. 9 is a close-up view of part of the CCD camera used in another location in the invention;

FIG. 10 is another close-up view of part of the CCD camera used in another location in the invention;

FIG. 11 is a perspective view of another endless carrying belt for the chips where means are used to adjust the position of each chip on the belt;

FIG. 12 is a perspective view of the fourth and fifth endless belts where the chips are subjected to electrical tests;

FIG. 13 is a close-up view of the chip on the fourth belt preparing to be electrically tested;

FIG. 14 is a close-up view of the underside of the fifth belt showing how the belt contacts the chips that are held to the fourth belt by vacuum;

FIG. 15 is a close up view of the cross-section of the fifth belt showing how the electrical conductors, traces and pads are interconnected;

FIG. 17 is a perspective view of the packaging facility for chips that have passed the visual and the electrical tests; and, FIG. 18 is a close-up view of the packaging tape used in this invention.

DESCRIPTION OF THE PREFERRED EMBODIMENT

Figure 16:
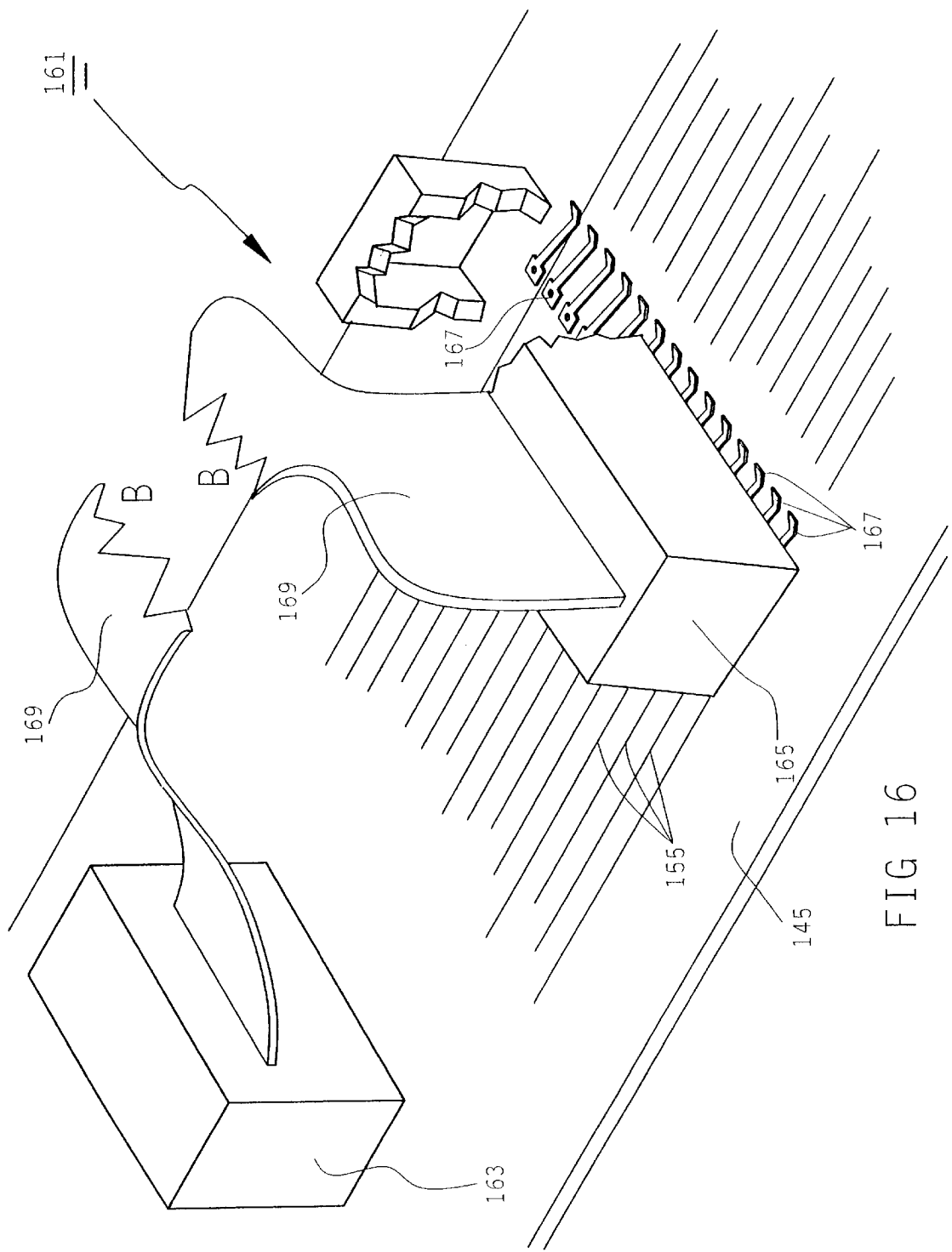
FIG. 16 is a perspective view of the testing facility for the chips on the fourth and fifth endless belts.

Turning now to the drawings wherein elements are identified by numbers and like elements are identified by like numbers throughout the eighteen figures, FIG. 1 shows one aspect of the invention 1 to comprise a loader 3 for assembling an inventory 5 of surface mount components 7 and feeding them out of said inventory and onto the top or outer surface 9 of a first moving endless belt 13. Loader 3 may be selected from a wide variety of loading devices. One such device is shown in U.S. Pat. No. 5,226,382.

First moving endless belt 13 is the main component of a first transfer assembly 15 wherein said belt 13 is mounted between a pair of spaced-apart spindles 17, one of which has a plurality of drive pins 19 extending radially outward therefrom for receipt in a plurality of pin holes 21 formed in belt 13 so that belt 13 may be driven therebetween, preferably at constant speed, in a racetrack pattern by a motor or other prime mover 25 attached to one spindle 17. Belt 13, preferably made of metal, such as stainless steel, is shown in FIGS. 2 and 3 to be defined by spaced-apart, opposed, outer and inner belt surfaces 9 and 27, respectively, and contains an area 29 of fine perforations or holes formed in at least said outer belt surface 13 that preferably passes through the entire thickness of belt 13 and exits inner belt surface 27. Area 29 can be continuous perforations as shown in FIG. 3 or a regularly sequenced perforation pattern as shown in FIG. 2. As shown in FIG. 1, a first vacuum box 31 is located under inner belt surface 27, between spindles 17, and draws a vacuum from a main line 33 through said perforations 29 from outer surface 9 along a portion of belt 13, as shown by the arrows in FIG. 3 for receipt of and retaining or holding surface mount components 7 issued from loader 3 in spaced-apart arrangement on said belt. The vacuum seats components 7 as they issue from loader 3 in a timed sequence and holds them tightly against outer belt surface 9, over area 29 of perforations, during their travel on belt 13.

As shown in FIG. 1 and more specifically in FIGS. 4, 5 and 6, a first surface mount component or chip upper-surface viewing device 35 is provided and located over top of belt 13, generally between spindles 17, and includes an illumination device such as one or more LEDs 37 for shining on the chips traveling on outer belt surface 9 to illuminate their exposed surfaces, and a lens 39 and charged-coupled device (CCD) camera 41 directed at the highlighted exposed surfaces of chips 7 for gathering and focusing the images of chip 7 and transmitting them to a nearby image processing and defect inspection system 43 that includes a keyboard, monitor and digital signal processor as shown. System 43 inspects the surfaces of chips 7 for cracks, chips, broken corners and other visual defects in the exterior and smearing of the solder between the separate exterior conductive surfaces. It is preferred that a pair of reflecting surfaces 45 be arranged, one on each side of first belt 13, in the area of lens 39, to reflect the exposed spaced-apart side surfaces of chips 7 toward lens 39 for additional areas of visual inspection. In this arrangement, the fore and aft side surfaces of chips 7, while exposed, are not brought into the field of inspection.

A second transfer assembly 47 is shown in FIG. 1 that includes a second moving endless, pin-driven belt 49, also preferably mounted between a pair of spaced-apart spindles 53 and driven therebetween, preferably at constant speed, in a racetrack pattern by a motor or other prime mover 55 attached to one spindle 53. Belt 49, also preferably made of metal, such as stainless steel, is defined by spaced-apart, opposed, outer and inner belt surfaces 57 and 59, respectively, and contains an area 61 of fine perforations or holes formed in at least said outer belt surface 57 that preferably passes through the entire thickness of belt 49 and exits inner belt surface 59. Area 61 can be just as shown for first belt 13 continuous perforations as shown in FIG. 3 or a regularly sequenced perforation pattern as shown in FIG. 2. A second vacuum box 63 is located between upper and lower parallel arms 65 and 67, respectively, of second belt 49, above lower parallel arm 67 upside down, and against inner belt surface 59 between spindles 53, and draws a vacuum from a main vacuum line 69 through said perforations from outer or top belt surface 57 along a free-span portion 71 of belt 49, for receipt and retention of surface mount components 7 transferred from first belt 13. The vacuum captures chips 7 as they are transferred from first belt 13 in an area where no vacuum is drawn through first area 29 of perforations but is drawn through second area 61 of perforations so that each chip 7 is very slightly lifted from first belt 13 and held by vacuum tightly against outer or top surface 57 of second belt 49 preferably on lower parallel arm of belt 67. Thus, as shown in FIG. 7, the top and sides of chip 7 may be visually inspected while it is moving in one direction shown by the arrow on first belt 13 and the bottom and other sides may be inspected while it is moving in another, orthogonal, direction as shown by the other arrow on second belt 49.

In its preferred embodiment shown in FIG. 1, the longitudinal axis X—X of first belt 13 is arranged orthogonal to the long axis X'—X' of second belt 49 so that chips 7 travel in a straight path on second belt 49 but turned 90° to the position they had when traveling on first belt 13. This means that the sides of chips 7, spaced-apart fore and aft on first belt 13, now become the spaced-apart side surfaces of chips 7 while traveling on second belt 49. In addition, while the bottom surface of chip 7 is adjacent first belt outer surface 9 during passage on first belt 13, the top surface of chip 7 is now adjacent second belt outer belt surface 57 when they ride on lower parallel arm 67 of second belt 49. This provides for the original bottom surface of chip 7, while adjacent first belt 13, to become the exposed or "upper" surface when chips 7 travel on lower parallel arm 67 of second belt 49.

As shown in FIG. 8 and more specifically in FIGS. 9 and 10, a second surface mount component or chip lower surface viewing device 73 is provided and located under lower parallel arm 67 of second belt 49, generally during travel of the chips between spindles 53 and includes an illumination device 75, such as one or more LEDs, for shining on the chips to illuminate their exposed surfaces, and a lens 77 directed at the highlighted exposed surfaces of chips 7 for gathering and focusing the images of chip 7 to an area for inspection such as one or more CCD cameras 79 located nearby that feed the images into the image processing and defect inspection system 43. A person then uses system 43 to inspect the exposed surfaces of chips 7 for visual defects such as cracks in the exterior, broken corners, and smearing of the solder between the exterior conductive surfaces. As shown in FIG. 10, it is preferred that a pair of reflecting surfaces or mirrors 81 be arranged, one on each side of second belt 49, in the area of lens 77, to reflect the exposed spaced-apart side surfaces of chips 7 toward lens 77 for additional areas of visual inspection. In this arrangement, the fore and aft side surfaces of chips 7, already previously examined at first viewing device 35, are not brought into the field of inspection.

A first means 83 for removing the chips, that have failed visual inspection, from second belt 49 is shown in FIG. 8 and shows a plurality of compressed air transfer lines 85 leading from a central manifold 87 that is fed by a compressed air line 89, that extend down through second vacuum box 63 to terminate at second area of perforations 61 above inner belt surface 59. A plurality of open-topped collection boxes 91 are arranged immediately below outer belt surface 57 and chips 7 as then pass by on second belt 49. Image processing and defect inspection system 43 is programmed to actuate one of a series of air passage valves (not shown) located inside manifold 87 that allow passage of compressed air through one of lines 85 against a small area in perforations 61 to force or "blow" a chip 7 down off second belt 49 into the appropriate one of collection boxes 91 depending upon whether the defect is of a certain type such as a crack in the main chip body, a chipped corner, a smear of the soldering paste or the like. By this means, the visually defective chips are gathered together with like defects and removed from further testing. This makes the testing procedure more cost efficient and allows the defective chips to be treated in batches for possible use in other areas where visual defects are not as critical.

Either at this stage, or at some previous stage in the travels of chip 7 through this novel multi-function viewer/tester, the chips must be placed on the endless belt in a specific orientation and in a specific location. To accomplish this, a second means 101 is provided, as shown in FIG. 11, to insure that the chip is both longitudinally and laterally positioned on a belt. For purposes of this explanation this belt will be identified as third endless belt 103. One form of second means 99 is shown in FIG. 11 includes a pair of opposed side paddles 103 that are reciprocally mounted for movement forward against chip 7 on belt 103 or rearward away from said chip. Side paddles 103 are controlled by a sighting device such as television camera 105. To control the fore and aft position of chips 7 on the belt, a flapper 107 is mounted on a shaft 108 extending out from inspection system 43 that is programmed to turn one way to move flapper 107 onto the belt to hold up movement of the chip thereon and to turn another way to remove flapper 107 from the belt to allow continued movement of the chip on the belt. The chips are held onto third belt 103 by a third vacuum box 109 through an area of perforations 110, similar to the other belts, but is not shown here for brevity. Area 110 can be continuous perforations or a regularly sequenced perforation pattern as previously explained.

In order to apply electrical tests to the chips, it is preferred in this invention to have chips 7 arranged with their conductive, soldered ends facing to the side of the longitudinal axis of the belt on which the tests are conducted. This means that if the belt conveying chips 7 past lower chip viewing device 43 has the chips arranged with their soldered ends facing to the side of the longitudinal axis of second belt 49, then the chips are to be conveyed straight ahead to the next belt for the electrical tests to continue to have the soldered ends face to the side of the longitudinal axis of second belt 49. Such a configuration is shown in FIG. 1. However, should the chips 7 be arranged with their conductive, soldered ends facing fore and aft along the longitudinal axis of the belt on which the second visual tests are conducted, then the chips must be transferred to another moving endless belt in racetrack pattern, orthogonal to the longitudinal axis from which they were just transferred. This will insure that the electrical tests will be conducted with the soldered ends of the chips facing to the side of the longitudinal axis of the belt on which the tests are conducted.

As shown in FIGS. 12 through 16, the assembly for applying a multiplicity of electrical tests to computer chips 7 includes fourth and fifth moving endless, pin-driven belts 115 and 117 respectively, each also preferably mounted between pairs of spaced-apart spindles 119 and 121 respectively, and driven therebetween, preferably at constant speed, in separate racetrack patterns by motors or other prime movers (not shown) attached to one spindle to form free spans or straight stretches 123 and 125, respectively, of said belts between said spindles. Fourth belt 115, is also preferably made of metal, such as stainless steel and is coated with a thin layer 127 of an electrically insulating material such as a plastic like polyvinyl chloride, polyvinylidene chloride, polyethylene, and the like, and is defined by spaced-apart, opposed, outer and inner belt surfaces 129 and 131, respectively. Fourth belt 115 has formed thereon an area 135 of perforations formed in at least said outer belt surface 129 that preferably passes through the entire thickness of belt 115 and exits inner belt surface 131. A fourth vacuum box 137 is located between upper and lower parallel arms 139 and 141 of fourth belt 115, adjacent upper parallel arm 139 and against inner belt surface 131, between spindles 121, and draws a vacuum through said perforations from outer surface 129 along free-span 123 of belt 115, for receipt and retention of surface mount components 7 transferred from third belt 103. The vacuum seats chips 7 as they are transferred from third belt 103, in an area where the vacuum for second belt 49 is terminated and is drawn through second area 61 of perforations, so that each chip 7 is merely taken from the previous belt, i.e., second belt 49 or third belt 103, and held by vacuum tightly against outer surface 129 of fourth belt 115.

Fifth belt 117 is unique in that it is arranged to be positioned above and parallel to fourth belt 115 and be brought into close, parallel and tangential contact with fourth belt outer surface 129 and into contact with chips 7 held thereon during their travel over straight span 123 as indicated by the down-arrows in FIG. 12. During contact of fifth belt 117 with chips 7 positioned on fourth belt 115, both belts move in unison and at the exact same speed so that chips 7 do not get moved around on either belt and that chips 7 are sandwiched between said belts. Fifth belt 117 is made of a non-electrically conductive material, such as rubber, is defined by spaced-apart, opposed, outer and inner belt surfaces 143 and 145, respectively, and contains therebetween a plurality of short, thin electrical conductors 149 arranged as shown in FIGS. 12 and 16 and preferably arranged vertically to pass through belt 117 between the opposed, spaced-apart belt surfaces 143 and 145. As shown in FIGS. 12 and 16, on inner belt surface 145, each conductor 149 terminates in a conductive trace or wire 151 that is directed along the outer surface 143 of belt 117 to one of a pair of small, electrically-conductive pads 153. Pads 153 are arranged in side-by-side, spaced-apart pairs. A pair of pads 153 is provided in spaced-apart arrangement at each location on said outer belt surface 143 preferably completely about exterior surface 143 of fifth belt 115 for electrical contact with the metalized ends of a chip 7. On inner belt surface 145, each conductor 149 terminates in a flat, continuous, electrically-conductive, facet-like surface 155 preferably even or level with the planar surface of inner belt surface 145 that continues around the entire inner surface of belt 115. Conductors 149, traces 151, pads 153 and facets 155 are arranged as shown in FIG. 15 in repeated patterns of increasing, spaced-apart width along the length of belt 115, in a somewhat repetitive "aligned arrow-head" outline pointed along the longitudinal axis of belt 115.

As shown in FIGS. 12 and 13, chips 7 pass along outer surface 129 of fourth endless belt 115 in a straight line axis X—X and in registered spacing there along. Fifth endless belt 117, moving in a racetrack pattern between spindles 119, is brought downward onto the components 7 riding on fourth endless belt 115 and is arranged to bring each pair of pads 153 into tangential contact with the soldered ends 157 chip 7. As each chip 7 is brought into contact with pads 153, the respective traces for that pair of pads connects that particular pair of pads through traces 151 and conductors 149 to facet surface 155 about inner belt surface 145. A plurality of these conductors thus connect each component 7 through pads 153 and traces 151 to conductors 149. Facet surfaces 155 are arranged individually about inner belt surface 145.

A third means 161 is provided to interconnect conductors 149 to an electrical testing facility 163 so that electrical tests can be conducted on components 7 as they pass between fourth belt 115 and fifth belt 117. Third means 161 is shown in FIG. 17 to comprise an elongated head 165 spanning across all facet surfaces 155 that are located on inner belt surface 145. A plurality of electrical contacts or slides 167 extend outward from head 165 across the span or width thereof. Said electrical contacts 167 are arranged to have one said contact riding in physical and electrical contact with one electrical conductors facet surface 155 so that each end of component 7 is electrically connected to a specific electrical contact 167 in head 165. A multiconductor electric cable 169 extends from head 165 to tester 163. The aforesaid described tests of CAP, Df, Flash, IR and both CAP and Df may then be sequentially performed by tester 163 directly on each component 7 that is captured between belts 115 and 117.

Components 7 may be unloaded into separate bins or storage containers depending upon the values determined by the tests conducted in this inventive assembly. However, where chips 7 are tested on a gross scale into "pass" and "fail" catagories, a discard means 93 may be used to remove failed chips from third belt 103. In this case, the passed chips may then be loaded into an elongated tape and wound in a reel for transfer to a production facility for later unwrapping and application to the surface of a computer circuit board.

One such form of loading is shown in FIGS. 17 and 18 where the chips 7 that passed the visual observation test and the electrical tests are allowed to remain on the outer surface of third endless belt 103 or fourth endless belt 115. In this case, a separate moving packaging tape 171 is provided on a feed spool 175 pivotally mounted on a spindle 177 to move between feed spool 175 and a windup spool 179 also pivotally mounted on a spindle 181 and driven by motor 183. Packaging tape 171 is characterized by having an upper surface 185, a lower surface 187 spaced-apart therefrom and a series of individual pockets 189 formed in said upper surface 185 and extending downward toward, but not all the way to, lower surface 187 and a free span 191 of packaging tape 171 extending between spools 175 and 179.

Fourth belt 115 and packaging tape 171 are connected to a counter and computer processor 193 to take into account all those chips 7 that were discarded due to failing either the visual test or the electrical tests. Belt 115 is then controlled to either speed up past an empty space on the belt or have packaging tape 171 stop momentarily to allow an empty space on fourth belt 115 to pass by before allowing another chip 7 to drop into a pocket 189. A blade 195 is provided to hold chips 7 in their respective pocket 189 until said pocket is sealed. A cover tape 195 is played out from a feed spool 199 and directed by idler roller 201 to be adhesively placed over pockets 189, as they are filled with a component 7, and then fed as a laminated package with packaging tape 171 to windup spool 179.

While the invention has been described with reference to a particular embodiment thereof, those skilled in the art will be able to make various modifications to the described embodiment of the invention without departing from the true spirit and scope thereof. It is intended that all combinations of elements and steps which perform substantially the same function in substantially the same way to achieve substantially the same result are within the scope of this invention.

What is claimed is:

1. A surface mount component outer surface inspection system comprising:
   a) a loader for assembling an inventory of surface mount components and feeding said surface mount components outward in controlled rectilinear manner and in a timed sequence;
   b) a first transfer assembly including a first moving endless belt in racetrack pattern, said belt having a partially perforated outer surface and a vacuum pulled through said perforations from said outer surface along a portion of said belt, for receipt of and retaining the surface mount components from said loader in spaced-apart arrangement on said belt;
   c) a surface-mount component, upper-surface viewing device for bringing the exposed surfaces of the moving components into focus at an area for inspecting said exposed surfaces for visual defects;
   d) a second transfer assembly including a second moving endless belt in racetrack pattern, said belt having a partially perforated outer surface and a vacuum pulled through said perforations from said outer surface along a portion of said belt, said second assembly adjacent said first endless belt located outside of said vacuum area of said first belt and spaced-apart from said upper-surface viewing device, for receipt of the surface-mount components on the opposite sides thereof from said first belt surface in similar spaced-apart arrangement;
   e) a surface-mount component, lower-surface viewing device for bringing the exposed surfaces of the components into focus at an area for inspecting said exposed surfaces for visual defects; and,
   f) means for determining the location of surface-mounted components that have failed the visual inspection and following said surface mounted components to a point where said failed components can be separated from other, successfully tested components on said second transfer assembly.

2. The surface-mount component, outer-surface inspection system of claim 1 wherein said second transfer assembly is arranged orthogonal to the axis of rectilinear motion of said first transfer assembly so that the surface-mount components are positioned 90° on said second belt from their original position on said first belt.

3. The surface-mount component, outer-surface inspection system of claim 1 wherein said components are transferred from said first belt surface in a similar spaced-apart arrangement to said second belt surface.

4. The surface-mount component, outer-surface inspection system of claim 1 wherein said loader is a rotary feeder.

5. The surface-mount component, outer-surface inspection system of claim 1 wherein said first moving endless belt further includes a partially perforated inner belt surface, spaced-apart from said outer belt surface and wherein said vacuum is pulled through said perforations from said outer surface across said belt and through said inner belt surface.

6. The surface-mount component, outer-surface inspection system of claim 1 wherein said surface-mount component, outer surface viewing device for bringing the exposed surfaces of the moving components into focus at an area for inspecting said exposed surfaces for visual defects includes at least one lens to converge the image of the surface-mount components for input to a visual inspection device.

7. The surface-mount component, outer surface inspection system of claim 6 wherein said visual inspection device includes an image processing and defect inspection system.

8. The surface-mount component, outer-surface inspection system of claim 1 further including a surface arranged to reflect the exposed side surfaces of the surface-mount components to said visual inspection device for inspection along with the exposed top surface of the components.

9. The surface-mount component, outer-surface inspection system of claim 1 further including a surface arranged to reflect the exposed side surfaces of the surface-mount components to said visual inspection device for inspection along with the exposed bottom surface of the components.

10. The surface-mount component, outer-surface inspection system of claim 1 wherein said first belt is metal.

11. The surface-mount component, outer-surface inspection system of claim 10 wherein said metal is stainless steel.

12. The surface-mount component, outer-surface inspection system of claim 1 further including a plurality of perforations arranged along said first belt, apart from said other perforations for receipt therein of the pins of a drive wheel arranged to direct said belt in said racetrack pattern.

13. The surface-mount component, outer-surface inspection system of claim 1 wherein said partially perforated surface is continuously perforated.

14. The surface-mount component, outer-surface inspection system of claim 1 wherein said partially perforated surface contains regularly sequenced perforations.

15. A machine for applying a multiplicity of electrical tests to a surface-mount, computer capacitor chip having spaced-apart electrically-conductive ends, comprising:
   a) a first moving carrier belt including a free span wherein one surface of said carrier belt includes means for temporarily holding the computer capacitor chip in fixed position on said span;
   b) a second moving tester belt including outer and inner belt surfaces, said tester belt comprising:

i) a plurality of closely-spaced, paired electrically conductive pads arranged along said outer belt surface to contact the opposed electrically-conductive ends of each capacitor chip when said second tester belt is brought into tangential contact with the computer capacitor chip positioned on said first belt;

ii) a plurality of paired electrical traces, one each extending from each said electrically-conductive pad;

iii) electrical conductors located at least partially in between said outer and said inner belt surfaces of said tester belt to electrically connect said individual pairs of said traces with individual wires exposed on said inner surface of said second belt; and, c) means for electrically interconnecting said exposed wires on said inner surface of said second belt with electrical test facilities.

16. The machine of claim 15 wherein the tests to be conducted on the computer capacitor chips are selected from the group consisting of a capacitance test, a flash test, and an insulation resistance test.

17. The machine of claim 15 wherein neither said first carrier belt nor said second tester belt have electrically-conductive surfaces.

18. The machine of claim 15 wherein said free span of said carrier belt is formed between two pulleys, independently and pivotally mounted in spaced-apart arrangement wherein one of said pulleys has formed thereon a plurality of outwardly directed, evenly spaced belt drive pins that are arranged to be received, one-at-a-time in a plurality of apertures formed in a straight line along a portion of said belt.

19. The machine of claim 15 where said free span of said carrier belt is straight and flat.

20. The machine of claim 15 wherein both said first and said second belts are endless belts arranged to move in racetrack patterns.

21. The machine of claim 15 wherein said carrier belt includes an area having a plurality of closely-spaced, finely sized perforations formed therethrough through which air passes under vacuum to hold the computer capacitor chips thereto by negative air pressure.

22. The surface-mount component, outer-surface inspection system of claim 15 wherein said partially perforated surface is continuously perforated.

23. The surface-mount component, outer-surface inspection system of claim 15 wherein said partially perforated surface contains regularly sequenced perforations.

24. The machine of claim 15 wherein one portion of said free span of said first carrier belt is formed between two pulleys pivotally mounted in spaced-apart arrangement wherein one of said pulleys has formed thereon a plurality of outwardly directed, evenly-spaced belt drive pins that are arranged to be received, one-at-a-time in a plurality of apertures formed in a straight line along a portion of said tester belt and wherein another portion of said free span includes an screened area having a plurality of closely-spaced, finely-sized holes formed therethrough through which air passes under vacuum to hold the computer capacitor chips thereto by negative air pressure.

25. The machine of claim 15 wherein said endless tester belt is made from a flexible, non-stretchable and non-electrically conductive material.

26. The machine of claim 15 wherein said second tester belt includes a straight and flat free span formed between two pulleys in spaced-apart arrangement wherein one of said pulleys has formed thereon a plurality of outwardly directed, evenly spaced belt drive pins that are arranged to be received, one-at-a-time in a plurality of apertures formed in a straight line along a portion of said tester belt.

27. The machine of claim 15 wherein said tester belt is an endless belt arranged in a racetrack pattern and said plurality of exposed wires on said inner belt surface are arranged to span the entire inner surface of said tester belt in closely-spaced, parallel order.

28. The machine of claim 25 wherein said plurality of exposed wires in said tester belt are each arranged in individual, spaced-apart planes and wherein each of said planes are arranged orthogonal to the plane of said free span of said tester belt.

29. The machine of claim 15 wherein said plurality of paired electrical pads are arranged in equal, spaced-apart order.

30. The machine of claim 15 wherein said plurality of paired electrical conductors are arranged in equal, spaced-apart order across said tester belt.

31. The machine of claim 15 further including means for spacing the computer capacitor chips along said carrier belt so that each chip is brought into accurate contact with said electrical pads located on said tester belt when said tester belt is brought into overlying contact with the chips.

32. The machine of claim 15 wherein said means for interconnecting said exposed wires of said tester belt includes a contact head spanning the width of said tester belt and including sliding contacts that extend from said head for contact with said exposed wires on said inner tester belt surface.

33. The machine of claim 15 wherein said carrier belt includes an area of perforations through said carrier belt and further includes a lower surface, wherein a vacuum is applied to said carrier belt through a vacuum box arranged against said lower belt surface under said free span for holding the chips against said upper surface of said carrier belt.

34. The surface-mount component, outer-surface inspection system of claim 15 wherein said partially perforated surface is continuously perforated.

35. The surface-mount component, outer-surface inspection system of claim 15 wherein said partially perforated surface contains regularly sequenced perforations.

36. A machine for applying a multiplicity of visual and electrical tests to a plurality of surface-mount computer capacitor chips, each chip defined by a top surface, bottom surface, spaced-apart side surfaces, and spaced-apart, electrically-conductive, opposed end surfaces, comprising:

a) a loader for assembling an inventory of chips and feeding the chips outwardly in controlled manner and in a timed sequence;

b) a first moving endless metal carrier belt arranged in racetrack pattern and including an upper surface, on which to receive the chips from said loader, a lower surface, and a free span wherein said first belt includes an area of perforations there through for temporarily holding a chip in fixed position by its bottom surface on said upper belt surface by vacuum applied from said lower belt surface thereby exposing the upper surface and sides of the chip for inspection;

c) a chip, upper-surface viewing device for bringing the upper and side exposed surfaces of the moving chips into focus at an area for inspecting said upper and side exposed chip surfaces for visual defects including a lamp to illuminate the chip, and an imaging device for inspecting the illuminated portion of the chip;

d) a second moving endless belt in racetrack pattern, said second belt having a partially perforated outer surface and a vacuum pulled through said perforations below said outer surface along a portion of said belt, said second belt located outside of said vacuum area of said first belt, for receipt of and holding the chips by their top surfaces thereof in similar spaced-apart arrangement thereby exposing the chip's uninspected bottom and conductive end surfaces for inspection;

e) a chip, lower-surface viewing device for bringing the lower and exposed end surfaces of the chip into focus at an area for inspecting the chips for visual defects;

f) means for adjusting the location and spacing of the chips on said second belt;

g) a fourth moving endless belt in racetrack pattern, said fourth belt having a partially perforated outer surface and a vacuum pulled through said perforations below said outer surface along a portion of said belt, said fourth belt located outside of said vacuum area of said second belt, for receipt of and holding the chips by their bottom surface, said fourth belt including a free span where the chips may be moved along by said fourth belt with their electrically-conductive ends arranged sideways to the direction of movement of said fourth belt;

h) a fifth moving endless tester belt in racetrack pattern, said fifth belt defined by outer and inner belt surfaces, and further comprising:

i) a plurality of closely-spaced, paired electrically conductive pads located along said fifth belt outer surface and arranged to contact the opposed electrically-conductive ends of each chip when said tester belt is brought into tangential contact with the chip positioned on said fourth belt;

ii) a plurality of paired electrical traces, one each extending outward along the surface of said fifth belt from each said electrically-conductive pad;

iii) electrical conductors located at least partially between said outer and said inner belt surfaces of said tester belt to electrically connect said individual pairs of said traces with individual wires exposed on said inner surface of said fifth belt; and, i) means for electrically interconnecting said exposed wires on said inner surface of said fifth belt with electrical test facilities.

37. The machine of claim 36 further including a third moving endless belt in racetrack pattern, said third belt having a partially perforated outer surface and a vacuum pulled through said perforations below said outer surface along a portion of said third belt, said third belt located outside of said vacuum area of said second belt, for receipt of and holding the chips by their respective bottom surfaces and including means for adjusting the location and spacing of the chips on said third belt.

38. The machine of claim 36 wherein the tests to be conducted on the chips are selected from the group consisting of a capacitance test, a flash test, and an insulation resistance test.

39. The machine of claim 36 wherein neither said first carrier belt nor said second tester belt have electrically-conductive surfaces.

40. The machine of claim 36 wherein the free spans of each of said belts are formed between two pulleys, independently and pivotally mounted in spaced-apart arrangement wherein one of said pulleys has formed thereon a plurality of outwardly directed, evenly spaced belt drive pins that are arranged to be received, one-at-a-time in a plurality of apertures formed in a straight line along a portion of said belts.

41. The machine of claim 36 where said free spans of said first and said fifth belts are straight and flat.

42. The machine of claim 36 wherein said first, second, third, and fourth belts include areas having a plurality of closely-spaced, finely sized perforations formed there through through which air passes under vacuum to hold the chips thereto by negative air pressure.

43. The chip, outer-surface inspection system of claim 36 wherein said partially perforated surfaces are continuously perforated.

44. The chip outer-surface inspection system of claim 36 wherein said partially perforated surface contains regularly sequenced perforations.

45. The machine of claim 36 wherein one portion of said free span of each said belts is formed between two pulleys pivotally mounted in spaced-apart arrangement wherein one of said pulleys has formed thereon a plurality of outwardly directed, evenly-spaced belt drive pins that are arranged to be received, one-at-a-time in a plurality of apertures formed in a straight line along a portion of each of said belts and wherein another portion of each said free span includes a screened area having a plurality of closely-spaced, finely-sized holes formed there through through which air passes under vacuum to hold the chips thereto by negative air pressure.

46. The machine of claim 36 wherein said endless fifth belt is made from a flexible, non-stretchable and non-electrically conductive material.

47. The machine of claim 36 wherein said fifth belt includes a straight and flat free span formed between two pulleys in spaced-apart arrangement wherein one of said pulleys has formed thereon a plurality of outwardly directed, evenly spaced belt drive pins that are arranged to be received, one-at-a-time in a plurality of apertures formed in a straight line along a portion of said fifth belt.

48. The machine of claim 36 wherein said fifth belt is an endless belt arranged in a racetrack pattern and said plurality of exposed wires on said inner belt surface are arranged to span the entire inner surface of said fifth belt in closely-spaced, parallel order.

49. The machine of claim 48 wherein said plurality of exposed wires in said fifth belt are each arranged in individual, spaced-apart planes and wherein each said planes are arranged orthogonal to the plane of said free span of said fifth belt.

50. The machine of claim 48 wherein said plurality of paired electrical pads are arranged in equal, spaced-apart order.

51. The machine of claim 48 wherein said plurality of paired electrical conductors are arranged in equal, spaced-apart order across said fifth belt.

52. The machine of claim 48 further including means for spacing the chips along said fourth belt so that each chip is brought into accurate contact with said electrical pads located on said fifth belt when said fourth belt is brought into overlying contact with the chips.

53. The machine of claim 48 wherein said means for interconnecting said exposed wires of said fifth belt includes a contact head spanning the width of said fifth belt and including sliding contacts that extend from said head for contact with said exposed wires on said inner fifth belt surface.

54. The machine of claim 48 wherein said fourth belt includes an area of perforations through said belt and further includes a lower surface, wherein a vacuum is applied to said fourth belt through a vacuum box arranged against said lower belt surface under said free span for holding the chips against said upper surface of said fourth belt.

* * * * *